(12) United States Patent
Ebisawa

(10) Patent No.: US 11,207,743 B2
(45) Date of Patent: Dec. 28, 2021

(54) SOLDER PROCESSING DEVICE

(71) Applicant: AND Co., Ltd., Kyoto (JP)

(72) Inventor: Mitsuo Ebisawa, Kizugawa (JP)

(73) Assignee: AND Co., Ltd., Souraku-gun (JP)

( * ) Notice: Subject to any disclaimer, the term of this patent is extended or adjusted under 35 U.S.C. 154(b) by 843 days.

(21) Appl. No.: 15/561,488

(22) PCT Filed: Mar. 25, 2016

(86) PCT No.: PCT/JP2016/059543
§ 371 (c)(1),
(2) Date: Sep. 25, 2017

(87) PCT Pub. No.: WO2016/153017
PCT Pub. Date: Sep. 29, 2016

(65) Prior Publication Data
US 2018/0065201 A1 Mar. 8, 2018

(30) Foreign Application Priority Data
Mar. 26, 2015 (JP) .............................. JP2015-063548

(51) Int. Cl.
*B23K 1/002* (2006.01)
*H05K 3/34* (2006.01)
(Continued)

(52) U.S. Cl.
CPC ................ *B23K 1/002* (2013.01); *B23K 3/02* (2013.01); *B23K 3/0315* (2013.01); *B23K 3/06* (2013.01);
(Continued)

(58) Field of Classification Search
CPC .......... B23K 1/002; B23K 3/02; B23K 3/002; B23K 3/0315; B23K 3/0353; B23K 3/06;
(Continued)

(56) References Cited

U.S. PATENT DOCUMENTS

2001/0030225 A1* 10/2001 Nagata ................ B23K 3/0607
228/256

FOREIGN PATENT DOCUMENTS

| EP | 3272449 A1 | 1/2018 |
| JP | H9-108826 A | 4/1997 |

(Continued)

OTHER PUBLICATIONS

English translation to JP 2016-059927 (Year: 2016).*
Webster definition of "Burr" (Year: 2020).*
International Search Report (ISR) of PCT/JP2016/059543 dated Jun. 7, 2016.

*Primary Examiner* — Phuong T Nguyen
*Assistant Examiner* — Bonita Khlok
(74) *Attorney, Agent, or Firm* — Metrolex IP Law Group, PLLC

(57) ABSTRACT

In a solder processing device (A) which includes: a substantially tubular iron tip (5) that can be heated and that is extended vertically; and a solder piece supply portion (2, 6) that supplies a solder piece (Wh) from above into the iron tip (5), and in which the heat of the iron tip (5) is used to melt the solder piece (Wh) such that the molten solder is supplied downward, the supplied solder piece (Wh) is forcefully brought into contact with the inner wall of the iron tip (5). In this way, it is possible to more reliably heat and melt the solder piece (Wh) by use of the heat of the iron tip (5).

14 Claims, 13 Drawing Sheets

(51) Int. Cl.
  *B23K 3/06* (2006.01)
  *B23K 3/02* (2006.01)
  *B23K 3/03* (2006.01)

(52) U.S. Cl.
  CPC ............ *B23K 3/063* (2013.01); *B23K 3/0615* (2013.01); *H05K 3/34* (2013.01)

(58) Field of Classification Search
  CPC .... B23K 3/0615; B23K 3/063; B23K 1/0016; B23K 3/0338; B23K 3/0607; B23K 3/082; H05K 3/34
  USPC .......... 219/136, 137 MW, 137.61, 148, 615, 219/616, 617
  See application file for complete search history.

(56) References Cited

FOREIGN PATENT DOCUMENTS

| | | | |
|---|---|---|---|
| JP | 2009-195938 | A | 9/2009 |
| JP | 2011-056581 | A | 3/2011 |
| JP | 2013-077840 | A | 4/2013 |
| JP | 2015-076496 | A | 4/2015 |
| JP | 2016-059927 | A | 4/2016 |
| JP | 2016059927 | * | 4/2016 |

* cited by examiner

INNER WALL OF IRON
TIP AND SOLDER PIECE IN
CONTACT

ROD-SHAPED MEMBER AND
SOLDER PIECE IN CONTACT

INNER WALL OF IRON
TIP AND SOLDER PIECE IN
CONTACT

INNER WALL OF IRON
TIP AND SOLDER PIECE IN
CONTACT

SOLDER PROCESSING DEVICE

TECHNICAL FIELD

The present invention relates to a solder processing device which heats and melts a solder piece.

BACKGROUND ART

In recent years, electronic circuits on which electronic components are mounted have been incorporated in various types of devices. In a step of forming an electronic circuit, in order to perform, for example, processing for joining a lead wire to a wiring pattern (land) on a board, soldering using a soldering iron is performed. In order to mechanically realize a soldering step, a solder processing device having a portion of an iron tip is utilized.

For example, the solder processing device as described above is configured such that a solder piece (piece obtained by cutting a wire solder) is supplied into the iron tip which is heated, that the heat of the iron tip is used to heat and melt the solder piece and that thus the molten solder is supplied downward. In this way, it is possible to realize the soldering step on the board arranged below.

RELATED ART DOCUMENT

Patent Document

Patent Document 1: Japanese Unexamined Patent Application Publication No. 09-108826
Patent Document 2: Japanese Unexamined Patent Application Publication No. 2011-056581
Patent Document 3: Japanese Unexamined Patent Application Publication No. 2009-195938

DISCLOSURE OF THE INVENTION

Problems to be Solved by the Invention

When as described above, the heat of the iron tip is used to heat and melt the solder piece, in order to reliably transmit the heat of the iron tip to the solder piece, it is important to reliably bring the solder piece into contact with the inner wall of the iron tip. However, for example, when the solder piece supplied from above into the iron tip is erected straight on the board or a terminal arranged below, the solder piece can be brought into a state where the solder piece does not make contact with the inner wall of the iron tip at all.

In such a case, it is likely that the heat transfer from the iron tip to the solder piece is inhibited, and that thus the solder piece cannot be appropriately melted. In view of the foregoing problem, the present invention has an object to provide a solder processing device which can more reliably heat and melt a solder piece by use of the heat of an iron tip.

Means for Solving the Problem

A solder processing device according to the present invention includes: a substantially tubular iron tip that can be heated and that is extended vertically; and a solder piece supply portion that supplies a solder piece from above into the iron tip, the heat of the iron tip is used to melt the solder piece such that the molten solder is supplied downward and the supplied solder piece is forcefully brought into contact with the inner wall of the iron tip. In this configuration, it is possible to more reliably heat and melt the solder piece by use of the heat of the iron tip.

In the configuration described above, more specifically, within the iron tip, a reception portion may be provided which receives the supplied solder piece, and in a state where the solder piece is held so as to be erected on the reception portion, the solder piece may be melted.

In the configuration described above, more specifically, the reception portion may be formed such that the inside diameter of the iron tip is smaller than the outside diameter of the solder piece. In the configuration described above, more specifically, the reception portion may be formed such that the inside diameter of the iron tip is gradually decreased as the iron tip is extended downward.

In the configuration described above, more specifically, the solder piece supply portion may produce the solder piece in which a burr is produced by cutting a wire solder, and the reception portion may be formed so as to receive the solder piece by catching of the burr.

In the configuration described above, more specifically, the reception portion may be a substantially rod-shaped protrusion which is protruded from an inner wall of the iron tip.

In the configuration described above, more specifically, the upper surface of a tip end portion of the protrusion may be inclined downward as the upper surface is extended to the tip end.

In the configuration described above, more specifically, the protrusion may be formed integrally with the iron tip.

In the configuration described above, more specifically, the protrusion may be formed with a rod-shaped member which is inserted into a through hole that is formed in the iron tip so as to be extended from the outer surface to the inner wall.

In the configuration described above, more specifically, the rod-shaped member may include an enlarged diameter portion, and the enlarged diameter portion may make contact with the iron tip such that the amount of protrusion of the rod-shaped member from the inner wall of the iron tip is determined.

In the configuration described above, more specifically, the through hole may include a step portion which is narrowed toward the direction of the inner wall of the iron tip, and the enlarged diameter portion may make contact with the step portion such that the amount of protrusion of the rod-shaped member from the inner wall of the iron tip is determined.

In the configuration described above, more specifically, the reception portion may be a substantially rod-shaped member which passes through the inner wall of the iron tip.

In the solder processing device configured as described above, a terminal protruded upward is soldered to a board, and in a state where a tip end of the terminal enters the iron tip from below, the supply is performed such that the solder piece is erected on the tip end of the terminal, the erected solder piece may be inclined so as to make contact with the inner wall of the iron tip. In the configuration described above, more specifically, the solder piece supply portion may obliquely cut a wire solder so as to produce the solder piece.

In the solder processing device configured as described above, a terminal protruded upward is soldered to a board, and in a state where a tip end of the terminal enters the iron tip from below, the supply is performed such that the solder piece is erected on the tip end of the terminal, the inner wall of the iron tip may be extended so as to be inclined with respect to an up/down direction such that the solder piece makes contact with the inner wall of the iron tip.

Advantages of the Invention

With the solder processing device according to the present invention, it is possible to more reliably heat and melt a solder piece by use of the heat of an iron tip.

DESCRIPTION OF EMBODIMENTS

Embodiments of the present invention will be described below using, as examples, first to fourth embodiments with reference to drawings. The details of the present invention are not limited at all to these embodiments.

1. First Embodiment

Figure 1:
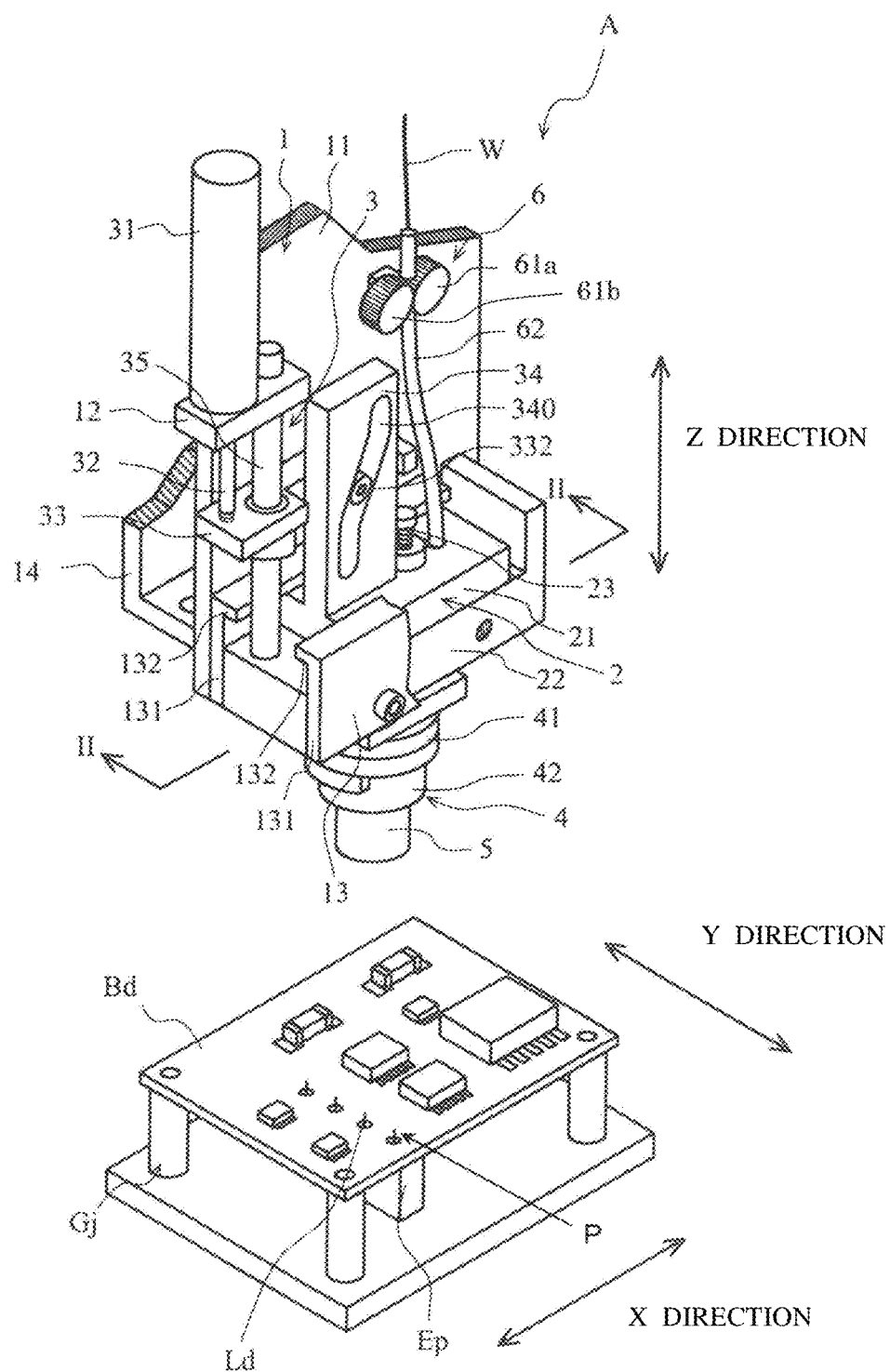
FIG. 1 A perspective view of an example of a soldering device according to an embodiment of the present invention.
Figure 2:
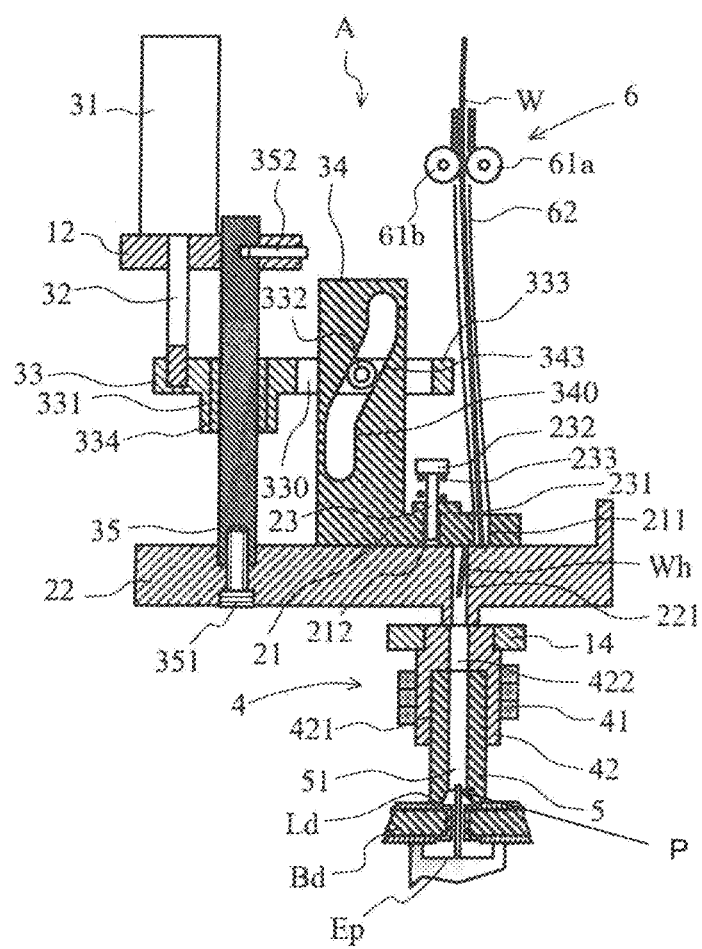
FIG. 2 A cross-sectional view taken along line II-II in the soldering device shown in FIG. 1.
Figure 3:
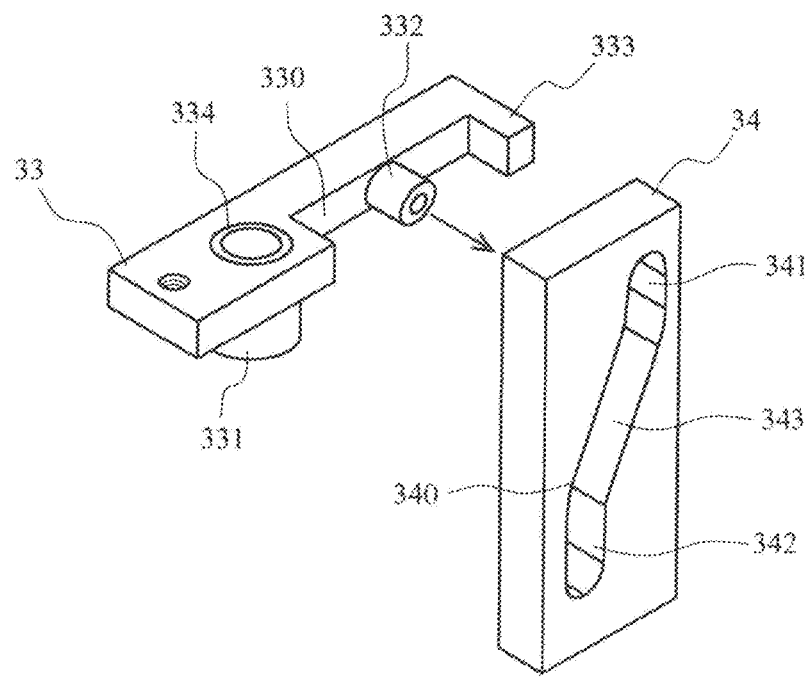
FIG. 3 An exploded perspective view of part of a drive mechanism provided in the soldering device shown in FIG. 1.

[Overall Configuration of Soldering Device]
FIG. 1 is a perspective view of a soldering device (one form of a solder processing device) according to the first embodiment, FIG. 2 is a cross-sectional view taken along line II-II in the soldering device A shown in FIG. 1 and FIG. 3 is an exploded perspective view of part of a drive mechanism provided in the soldering device A shown in FIG. 1. In FIG. 1, parts of an enclosure and a support portion 1 are cut out, and thus the interior of the soldering device A is displayed.

As shown in FIG. 1, the soldering device A is a device in which a wire solder W is supplied from above, and in which an iron tip 5 provided in a lower portion is utilized so as to solder a wiring board Bd arranged below the iron tip 5 and an electronic component Ep. The wire solder W has a structure in which a flux layer is provided within a tubular solder layer. Hence, a solder piece produced by cutting the wire solder W likewise has the structure in which the flux layer is provided within the tubular solder layer (see FIG. 4). The soldering device A includes the support portion 1, a cutter unit 2, the drive mechanism 3, a heater unit 4, the iron tip 5 and a solder feed mechanism 6. A combination of the heater unit 4 and the iron tip 5 forms a soldering iron portion.

The support portion 1 includes a wall member 11 which is provided so as to stand and which is formed in the shape of a flat plate. In the following description, for convenience, it is assumed that as shown in FIG. 1, a horizontal direction along the wall member 11 is an X direction, that a horizontal direction perpendicular to the wall member 11 is a Y direction and that a vertical direction along the wall member 11 is a Z direction (up/down direction). For example, as shown in FIG. 1, the wall member 11 has a Z-X flat surface.

The soldering device A supplies molten solder to the wiring board Bd attached to a jig fixture Gj and a terminal P of the electronic component Ep arranged on the wiring board Bd, and thereby connects and fixes them. When soldering is performed, the jig fixture Gj is moved in the X direction and the Y direction so as to locate a land Ld on the wiring board Bd. Then, the soldering device A can be moved in the Z direction, and after the location, the soldering device A is moved in the Z direction, and thus it is possible to bring the tip end of the iron tip 5 into contact with the land Ld.

The support portion 1 includes: a holding portion 12 which is provided in a position displaced upward from a lower end portion of the wall member 11 in the Z direction; a sliding guide 13 which is fixed to a side edge portion (lower portion) of the wall member 11 in the Z direction; and a heater unit fixing portion 14 which is provided at an end portion (lower end portion) of the wall member 11 in the Z direction.

The cutter unit 2 cuts the wire solder W fed by the solder feed mechanism 6 into a solder piece Wh which has a predetermined length. The cutter unit 2 includes: a cutter lower blade 22 (fixed blade portion) which is fixed to the sliding guide 13; a cutter upper blade 21 (movable blade portion) which is arranged in an upper portion of the cutter lower blade 22 and which is arranged so as to be able to slide in the X direction; and a pusher pin 23 (solder pushing portion) which is provided in the cutter upper blade 21 and which slides in a direction (Z direction) intersecting the direction of sliding of the cutter upper blade 21. As shown in FIG. 1, the movement of the cutter upper blade 21 in the Z direction is restricted by the sliding guide 13, and the cutter upper blade 21 can slide in the X direction.

Here, the sliding guide 13 will be described in detail. The sliding guide 13 includes a pair of wall portions 131 which make contact with both ends of the cutter lower blade 22 in the Y direction, and the pair of wall portions 131 include stopper portions 132 which are protruded toward the other side. In the stopper portions 132, tip ends are prevented from making contact with each other, and in other words, an opening is provided in an upper portion of the sliding guide 13. The stopper portions 132 restrict the movement of the cutter upper blade 21 in the Z direction.

As shown in FIG. 2, the cutter upper blade 21 includes an upper blade hole 211 that is a through hole into which the wire solder W fed by the solder feed mechanism 6 is inserted and a pin hole 212 that is a through hole into which the rod portion 231 of the pusher pin 23 is inserted. The side edge portion of the upper blade hole 211 at the lower end is formed in the shape of a cutting blade. The cutter lower blade 22 includes a lower blade hole 221 that is a through hole into which the wire solder W passing through the upper blade hole 211 is inserted. The side edge portion of the lower blade hole 221 at the upper end is formed in the shape of a cutting blade. In a state where the wire solder W is inserted into the upper blade hole 211 and the lower blade hole 221, they are displaced in a direction intersecting the wire solder W, and thus the wire solder W is cut by the cutting blades thereof.

The pusher pin 23 is the solder pushing portion, and pushes downward the solder piece Wh which is left in the lower blade hole 221 after being cut by the cutter upper blade 21 and the cutter lower blade 22. The pusher pin 23 includes: the rod portion 231 which is slidably supported in the pin hole 212; a head portion 232 which is provided at the end portion of the rod portion 231; and a spring 233 which is wound around the rod portion 231 and which is arranged between the head portion 232 and the cutter upper blade 21. Furthermore, in the pusher pin 23, at the end portion of the rod portion 231 on the side opposite to the head portion 232, a stopper for reducing the removal of the rod portion 231 from the pin hole 212 is provided. The pusher pin 23 is constantly raised upward, that is, to the side opposite to the cutter lower blade 22 by the elastic force of the spring 233.

As shown in FIGS. 1 and 2, the drive mechanism 3 includes: an air cylinder 31 which is held by the holding portion 12; a piston rod 32 which passes through a through hole provided in the holding portion 12 and which is driven by the air cylinder 31 so as to slide in the Z direction; and a guide shaft 35 which is supported both by the holding portion 12 and the cutter lower blade 22, which is extended in the Z direction and which is formed in the shape of a cylinder. The drive mechanism 3 further includes: a cam member 33 that is supported by the guide shaft 35 so as to be able to slide in the Z direction; and a slider portion 34 that includes a cam groove 340 with which a pin 332 provided in the cam member 33 and described later is engaged.

The air cylinder 31 drives the piston rod 32 such that the piston rod 32 slides (expands and contracts) by the pressure of air supplied from the outside, and the air cylinder 31 and the piston rod 32 form the actuator of the drive mechanism 3. The piston rod 32 is provided parallel to the guide shaft 35, and linearly reciprocates along the guide shaft 35. A tip end portion of the piston rod 32 is fixed to the cam member 33, and the cam member 33 slides in the Z direction by the expansion and contraction of the piston rod 32. The sliding of the cam member 33 is guided by the guide shaft 35.

As shown in FIG. 2, a lower end portion of the guide shaft 35 is fitted into a concave hole provided in the cutter lower blade 22, and the guide shaft 35 is screwed and fixed to the cutter lower blade 22 with a screw 351. An upper portion of the guide shaft 35 passes through a hole provided in the holding portion 12, and the movement thereof is restricted by a pin 352. In other words, the guide shaft 35 is fixed with the screw 351 to the cutter lower blade 22 and is fixed with the pin 352 to the holding portion 12.

As shown in FIGS. 2 and 3, the cam member 33 is a rectangular member, and includes: a concave portion 330 that is obtained by cutting out part of a long side into a rectangular shape; and a cylindrical support portion 331 that is coupled to the cam member 33 and that includes a through hole through which the guide shaft 35 passes. In the concave portion 330, the slider portion 34 is arranged slidably (in the X direction and the Z direction). The support portion 331 is shaped so as to extend in a direction parallel to the pin 35, and is provided so as to reduce the rattling of the cam member 33. In other words, when the cam member 33 has a certain degree of thickness, and thus it is unlikely that rattling occurs, the cylindrical portion may be omitted such that only the through hole forms the support portion 331.

The cam member 33 further includes: the cylindrical pin 332 which is provided in an intermediate portion of the concave portion 330 and whose center axis is perpendicular to the guide shaft 35; a pin pushing portion 333 which is adjacent to the concave portion 330 and which pushes the pusher pin 23; and a bearing 334 which is arranged within the support portion 331. The pin 332 is inserted into the cam groove 340 which is provided in the slider portion 34 and which will be described later. The bearing 334 is a member which is externally fitted to the guide shaft 35 and which makes cam member 33 smoothly slide such that the cam member 33 is prevented from rattling.

As shown in FIGS. 2 and 3, the slider portion 34 is a member which is formed in the shape of a rectangular plate, and is formed integrally with the cutter upper blade 21. The slider portion 34 includes the cam groove 340 which passes through the plate in the direction of thickness of the plate and which is extended in a longitudinal direction. The cam groove 340 includes a first groove portion 341 on the upper side which is extended parallel to the guide shaft 35 and a second groove portion 342 on the lower side which is extended parallel to the guide shaft 35. The first groove portion 341 and the second groove portion 342 are provided so as to be displaced from each other in the X direction, and the cam groove 340 includes a connection groove portion 343 which connects the first groove portion 341 and the second groove portion 342.

The pin 332 of the cam member 33 is inserted into the cam groove 340, the cam member 33 is moved along the guide shaft 35 and thus the pin 332 slides on the inner surface of the cam groove 340. When the pin 332 is located in the connection groove portion 343 of the cam groove 340, the pin 332 pushes the inner surface of the connection groove portion 343. In this way, the slider portion 34 and the cutter upper blade 21 formed integrally with the slider portion 34 are moved (slide with respect to the cutter lower blade 22) in a direction (X direction) intersecting the direction of sliding of the cam member 33 (Z direction).

As shown in FIG. 2, the heater unit 4 is a heating device for heating and melting the solder piece Wh, and is fixed to the heater unit fixing portion 14 provided in a lower end portion of the wall member 22. The heater unit 4 includes a heater 41 which generates heat by passing electricity and a heater block 42 for attaching the heater 41. The heater 41 is wound around the outer circumferential surface of the cylindrical heater block 42.

The heater block 42 has a cylindrical shape, and includes: a concave portion 421 which is used for attaching the iron tip 5 to an end portion in the axial direction and whose cross section is circular; and a solder supply hole 422 which passes through from the center portion of a bottom portion of the concave portion 421 to the opposite side. The heater block 42 is provided in contact with the cutter lower blade 22 such that the solder supply hole 422 and the lower blade hole 221 communicate with each other. The heater block 42 is provided as described above, and thus the solder piece Wh is moved from the lower blade hole 221 to the solder supply hole 422.

The iron tip 5 is a member which is formed in the shape of a cylinder extended in an up/down direction and which can be heated, and includes a solder hole 51 in a center portion which is extended in the axial direction. The iron tip 5 is inserted into the concave portion 421 and is prevented from being removed with an unillustrated member. The solder hole 51 of the iron tip 5 communicates with the solder supply hole 421 of the heater block 42, and the solder piece Wh is fed from the solder supply hole 421.

The heat from the heater 41 is transmitted to the iron tip 5, and the solder piece Wh is melted by the heat. Hence, the iron tip 5 is formed of a material having a high thermal conductivity, for example, a ceramic such as a silicon carbide or an aluminum nitride or a metal such as tungsten. Although in the soldering device A, the iron tip 5 is formed in the shape of a cylinder, there is no limitation to this configuration, and the iron tip 5 which is formed in the shape of a tube whose cross section is polygonal or oval may be used. The iron tip 5 may be prepared that has a different shape according to the wiring board Bd and (or) the shape of the terminal P of the electronic component Ep on which soldering is performed.

As shown in FIGS. 1 and 2, the solder feed mechanism 6 supplies the wire solder W, and includes a pair of feed rollers 61a and 61b which feed the wire solder W and a guide tube 62 which guides the fed wire solder W to the upper blade hole 211 of the cutter upper blade 21. The pair of feed rollers 61a and 61b are attached to the support portion 1, sandwich the wire solder W and are rotated so as to feed the wire solder W downward. The guide tube 62 is a tubular member which can be elastically deformed, and the upper end thereof is arranged close to a portion of the feed rollers 61 from which the wire solder W is fed.

The lower end of the guide tube 62 is provided so as to communicate with the upper blade hole 211 of the cutter upper blade 21. The lower end of the guide tube 62 is moved so as to follow the sliding of the cutter upper blade 21, and the guide tube 62 is provided so as not to be excessively pulled or stick in the range of the sliding of the cutter upper blade 21. The length of the wire solder fed is determined by the rotation angles (the numbers of revolutions) of the individual feed rollers 61a and 61b.

When the soldering is performed with the soldering device A, the tip end of the iron tip 5 is brought into contact with the land Ld of the wiring board Bd on which the soldering is performed, and the land Ld and the terminal P of the electronic component Ep are surrounded by the iron tip 5. Here, the heat from the heater 41 is transmitted to the iron tip 5, and the iron tip 5 is brought into contact with the land Ld and the terminal P of the electronic component Ep such that they are heated (preheated) to a temperature suitable for the soldering.

[Operation of Soldering Device]

The operation of the soldering device A will then be described. As shown in FIG. 2, immediately before the soldering is performed, the soldering device A is in a state where the piston rod 32 is stored within the air cylinder 31, and the cam member 33 is in an upper portion (the uppermost portion of the range of the sliding) in the Z direction. Here, the pin 332 is located within the first groove portion 341 of the cam groove 340, and the cutter upper blade 21 is located in a position closest to the guide shaft 35. This position is assumed to be the initial position. The cutter upper blade 21 and the cutter lower blade 22 are formed such that when the soldering device A is in the initial position, the upper blade hole 211 and the lower blade hole 221 are overlaid on each other in the Z direction.

Then, the feed rollers 61a and 61b are driven to rotate so as to feed the wire solder W. Since the upper blade hole 211 and the lower blade hole 221 are in a state where they communicate with each other, the tip end of the wire solder W is moved into the lower blade hole 221. The rotation angles of the feed rollers 61a and 61b are adjusted such that the length of the wire solder W entering the lower blade hole 221 is the length of the solder piece Wh. The length of the solder piece Wh is determined according to, for example, the sizes of the land Ld and the terminal P of the electronic component Ep on which the soldering is performed.

Then, the piston rod 32 is protruded from the air cylinder 31, and thus the cam member 33 is moved downward along the guide shaft 35. Since the pin 332 is arranged within the cam groove 340, the pin 332 slides within the cam axis 340. When the pin 332 is in the first groove portion 341, since the first groove portion 341 coincides with the direction of movement of the pin 332 (the axial direction of the guide shaft 35), the slider portion 34 does not receive a force from the cam member 33, and thus the cam member 34 is stationary. Then, when the pin 332 reaches the connection groove portion 343 from the first groove portion 341, the pin 332 pushes the inner surface of the connection groove portion 343. In this way, a force in the X direction is applied to the slider portion 34, and thus the slider portion 34 and the cutter upper blade 21 formed integrally with the slider portion 34 are moved (slide) in the X direction.

The cutter upper blade 21 slides such that the upper blade hole 211 and the lower blade hole 221 are displaced in the X direction, and thus the cutting blade formed in the edge of the end portion of the upper blade hole 211 intersects the cutting blade formed in the edge of the end portion of the lower blade hole 221. Consequently, the wire solder W is cut, and thus the solder piece Wh is produced.

When the piston rod 32 is further protruded, the cam member 33 is further moved downward, and thus the pin 332 is moved from the connection groove portion 343 to the second groove portion 342. Since the second groove portion 342 is also extended parallel to the guide shaft 35, even when the cam member 33 is moved downward along the guide shaft 35, the pin 332 does not push the slider portion 34. In other words, although the cam member 33 is moved, the cutter upper blade 21 and the slider portion 34 are stopped. The cutter upper blade 21 is located in a position farthest from the guide shaft 35. The cutter upper blade 21 and the cutter lower blade 22 are formed such that when the cutter upper blade 21 is in this position, the pin hole 212 is overlaid on the lower blade hole 221 in the Z direction.

When the piston rod 32 is much further protruded, the cam member 33 slides downward, and thus the pin pushing portion 333 of the cam member 33 pushes the head portion 232 of the pusher pin 23. In this way, the rod portion 231 of the pusher pin 23 is inserted into the lower blade hole 221. Here, the solder piece Wh which is left in the lower blade hole 221 is pushed by the rod portion 231 so as to be moved toward the iron tip 5. Although the solder piece Wh may be moved downward by its weight at the time of cutting, by the utilization of the pusher pin 23, the solder piece Wh can be reliably supplied into the solder hole 51 of the iron tip 5.

Figure 4:
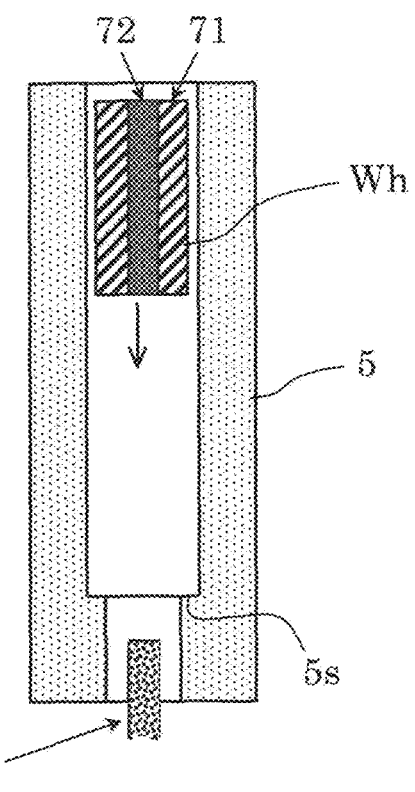
FIG. 4 An illustrative diagram of a process in which a solder piece is supplied into an iron tip in a first embodiment.

FIG. 4 shows how the solder piece Wh is supplied into the iron tip 5. As shown in the figure, a step 5s is provided within the iron tip 5. The step 5s is formed such that the inner walls of the iron tip 5 are extended inward and that thus the inside diameter of the iron tip 5 is less than the outside diameter of the solder piece Wh. The step 5s is located on the upper side with respect to the tip end of the terminal P of the electronic component Ep so as to play a role as a reception portion which receives the solder piece Wh supplied into the iron tip 5.

Figure 5:
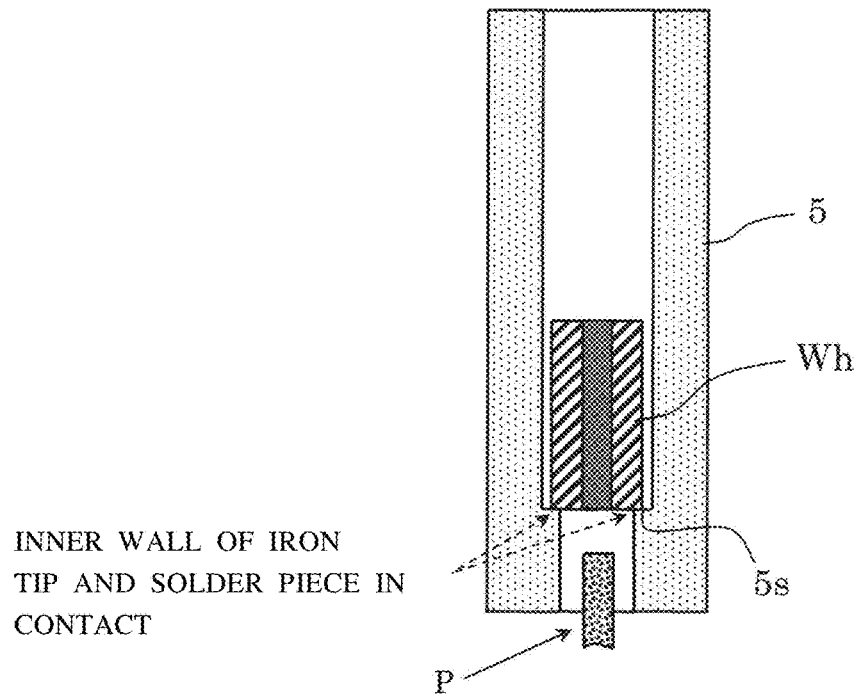
FIG. 5 An illustrative diagram of a state where the solder piece is supplied into the iron tip in the first embodiment.

Specifically, as shown in FIG. 4, the solder piece 5s dropped from above into the iron tip 5 is caught on the step 5s before reaching the terminal P of the electronic component Ep, and thus as shown in FIG. 5, the solder piece is held in a state where the solder piece is erected on the step 5s. The inside diameter of the iron tip 5 on the upper side with respect to the step 5s is set so as to be slightly larger than the outside diameter of the solder piece Wh. Hence, even when the solder piece Wh is inclined within the iron tip 5, the solder piece Wh is supported by the inner wall of the iron tip 5 as shown in FIG. 6 so as to be erected within the iron tip 5 without fail.

Figure 6:
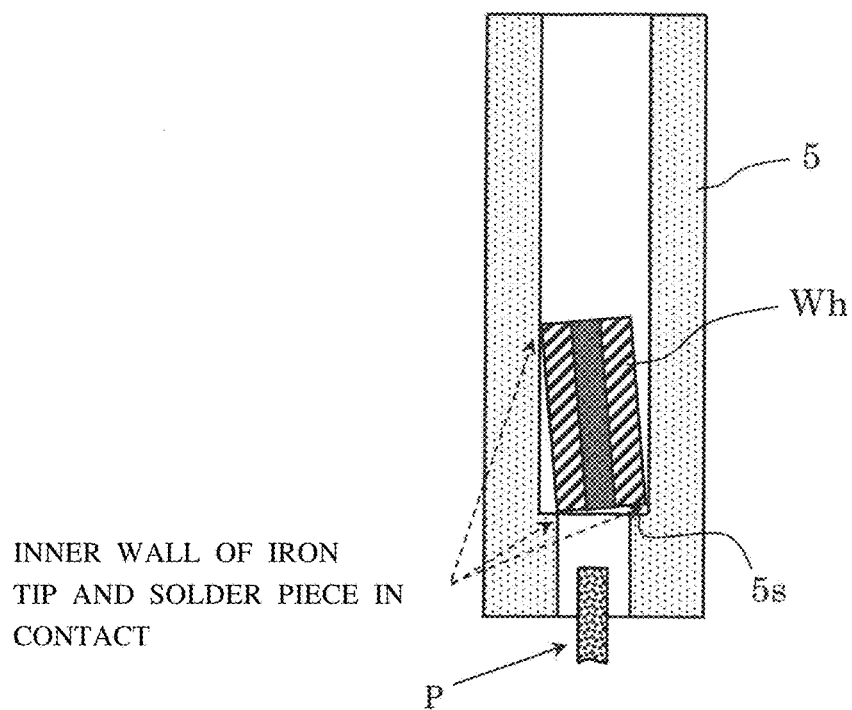
FIG. 6 Another illustrative diagram of the state where the solder piece is supplied into the iron tip in the first embodiment.

As is clear from FIGS. 5 and 6, at least part of the solder piece Wh supplied into the iron tip 5 is constantly brought into contact with the inner wall (including the step 5s) of the iron tip 5. If the step 5s (reception portion) is not provided, it is likely that the solder piece Wh is erected straight on the terminal P of the electronic component Ep so as not to make contact with any portion of the inner wall of the iron tip 5. Hence, it is said that the step 5s plays a role in preventing noncontact between the supplied solder piece Wh and the inner wall of the iron tip 5 (in other words, in forcefully bringing the supplied solder piece Wh into contact with the inner wall of the iron tip 5).

Heat from the heater 41 is transmitted to the iron tip 5, and the solder piece Wh is heated by the heat. Here, since the solder piece Wh is held on the step 5s, and the solder piece Wh and the inner wall of the iron tip 5 are constantly brought into contact with each other, as compared with a case where the solder piece Wh and the inner wall of the iron tip 5 are not in contact with each other, it is possible to more reliably transmit the heat of the iron tip 5 to the solder piece Wh.

The solder piece Wh is received by the step 5s so as not to make contact with the terminal P of the electronic component Ep, and thus the heat of the solder piece Wh is prevented from being removed by the terminal P. Furthermore, when the solder piece Wh is heated to a certain extent, the flux flows out from the interior of the solder piece Wh so as to be interposed between the solder piece Wh and the inner wall of the iron tip 5, and thus the contactability therebetween is more enhanced. For the reasons described above, in the present embodiment, the heating of the solder piece Wh is efficiently performed, and thus a failure in which the solder piece Wh is insufficiently heated and melted is prevented as much as possible.

The molten solder flows along the inner wall of the iron tip 5 while being diffused, and when the molten solder reaches the land Ld, the molten solder is equalized in a circumferential direction and is supplied. Since the iron tip 5 surrounds the land Ld of the wiring board Bd and the terminal P of the electronic component Ep, the molten solder flows equally in the circumferential direction to the land Ld and the terminal P of the electronic component Ep located below. Then, the soldering device A is moved in the Z direction, and thus the iron tip 5 is moved away from the land Ld. In this way, the solder is cooled by outside air so as to be solidified, and thus the land Ld and the terminal P of the electronic component Ep are soldered.

Then, when the soldering is completed, the air cylinder 31 stores the piston rod 32 thereinto. In this way, the cam member 33 is moved upward in the Z direction, and the pusher pin 23 is pushed upward by the elastic force of the spring 233. The rod portion 231 is removed from the lower blade hole 221. Even if the cutter upper blade 21 slides in this state, the pusher pin 23 is not broken. Then, the pin 332 of the cam member 33 reaches the connection groove portion 343 of the cam groove 340, and the slider portion 34 and the cutter upper blade 21 slide so as to approach the guide shaft 35. When the pin 332 reaches the first groove portion 341 of the cam groove 340, the soldering device A is returned to the initial position.

[Form of Step Within Iron Tip]

With respect to the form of the step 5s (reception portion) provided within the iron tip 5, as long as the solder piece Wh supplied from above can be reliably received, other forms may be adopted. Specific examples of the other forms will be described below.

Figure 7:
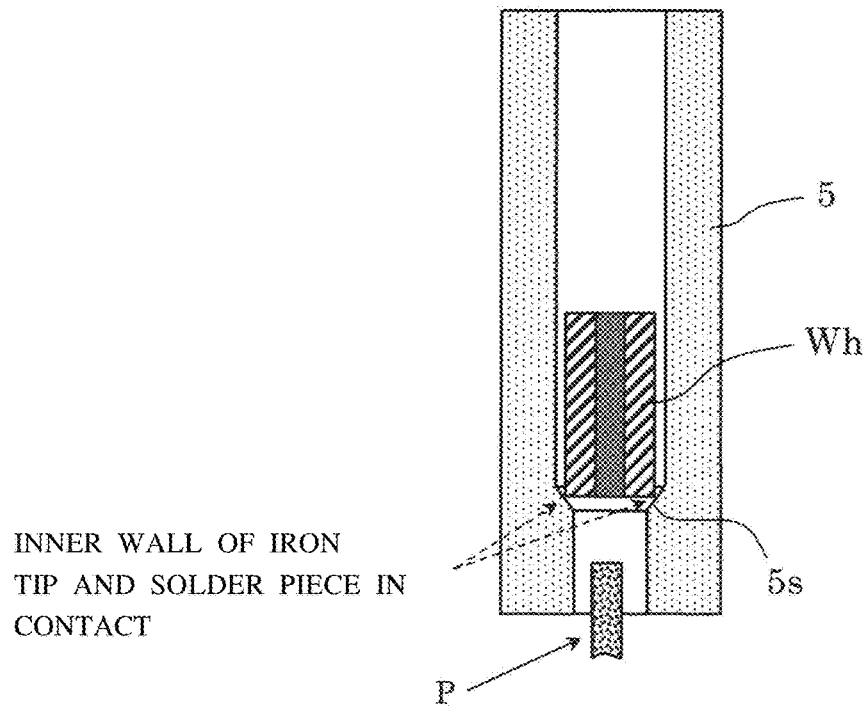
FIG. 7 An illustrative diagram of another form of a step within the iron tip.

FIG. 7 shows an example where the step 5s is formed in a tapered shape such that the inside diameter of the iron tip 5 is gradually decreased as the iron tip 5 is extended downward. On the upper side with respect to the tapered region, the inside diameter of the iron tip 5 is slightly larger than the outside diameter of the solder piece Wh whereas on the lower side, the inside diameter of the iron tip 5 is slightly smaller than the outside diameter of the solder piece Wh. In the example shown in FIG. 7, the lower end portion of the solder piece Wh hits the tapered region, and thus it is possible to reliably receive the solder piece Wh supplied from above.

Figure 8:
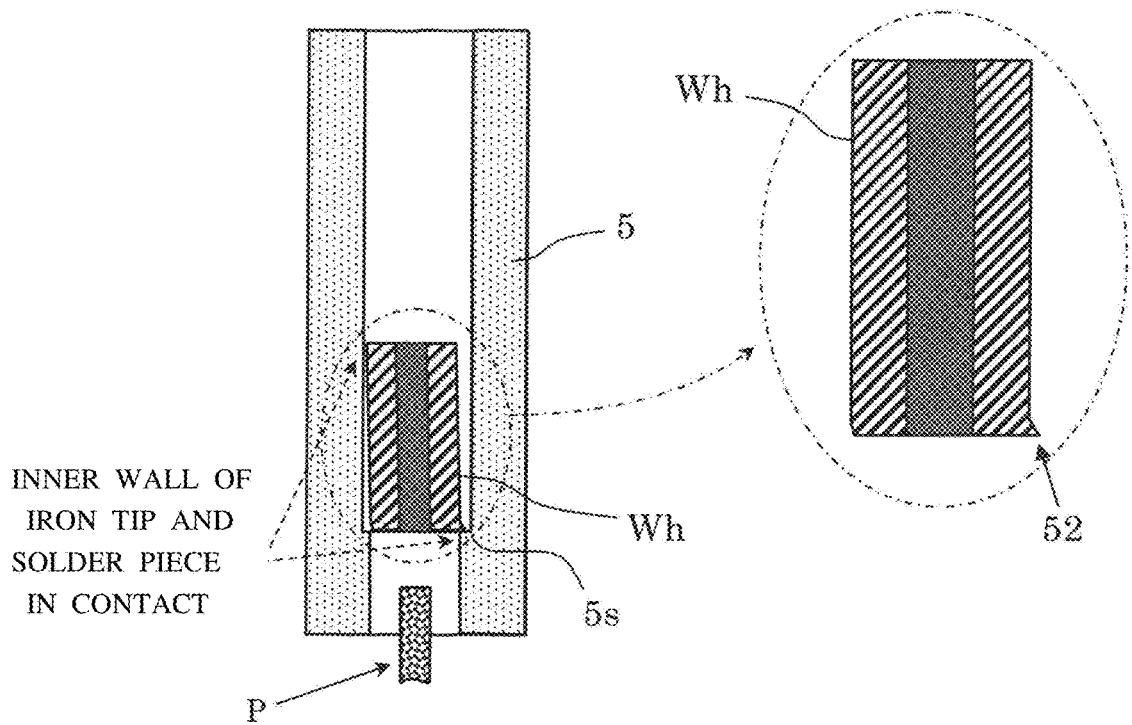
FIG. 8 An illustrative diagram of still another form of the step within the iron tip.

FIG. 8 shows an example where the step 5s is formed such that the solder piece Wh is received by the catching of a burr 52 of the solder piece Ah. Specifically, when the wire solder W is cut by the cutter unit 2, the cut surface is pulled in the direction of cutting so as to be slightly deformed, and thus as shown in the enlarged view of FIG. 8, the solder piece Wh in which the burr 52 is produced at a tip end portion is produced. In the example shown in FIG. 8, the dimensions and the shape of the step 5s are set such that the solder piece Wh can be received by the catching of the burr 52.

2. Second Embodiment

The second embodiment will then be described. The second embodiment is basically the same as the first embodiment except the reception portion for receiving the solder piece Wh supplied into the iron tip 5. In the following description, emphasis is placed on the description of portions which differ from those in the first embodiment, and the description of the common portions may be omitted.

Figure 9:
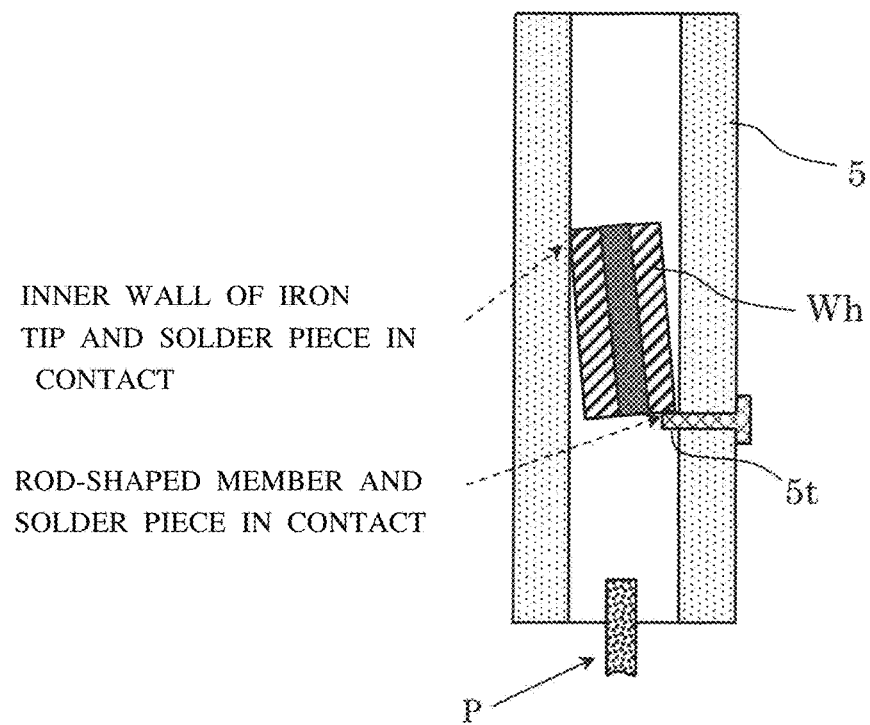
FIG. 9 An illustrative diagram of a state where the solder piece is supplied into the iron tip in a second embodiment.
Figure 10:
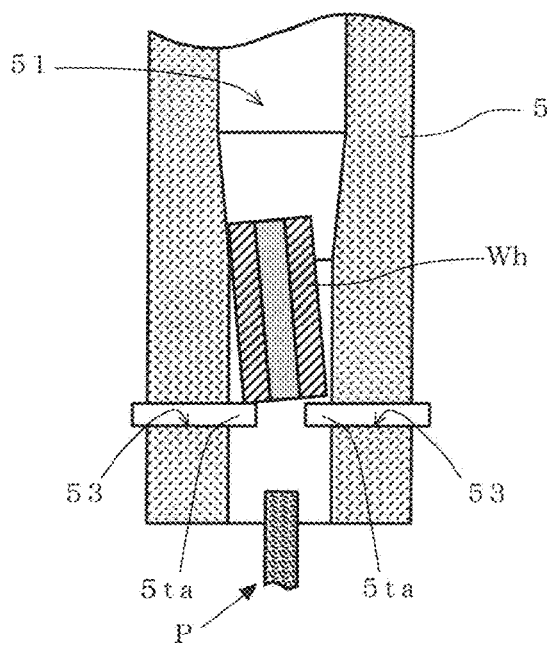
FIG. 10 An illustrative diagram showing another example of the second embodiment.

In the soldering device A of the second embodiment, as shown in FIG. 9, a rod-shaped member 5t which is inserted inward from the outer surface is provided in the iron tip 5.

The rod-shaped member 5t reaches the interior of the iron tip 5, and a tip end portion of the rod-shaped member 5t is a rod-shaped protrusion which is protruded from the inner wall of the iron tip 5. The protrusion portion functions as the reception portion for receiving the solder piece Wh supplied from above into the iron tip 5.

As shown in FIG. 9, the solder piece Wh received by the rod-shaped member 5t is inclined to the side opposite to the protrusion portion. In this way, the lower end portion of the solder piece Wh is brought into contact with the rod-shaped member 5t, and the upper end portion of the solder piece Wh is brought into contact with the inner wall of the iron tip 5. As described above, even in the present embodiment, it is possible to forcefully bring the solder piece Wh into contact with the inner wall of the iron tip 5.

Other examples of the second embodiment will be shown in FIGS. 10 to 18B. An iron tip 5 shown in FIG. 10 includes two through holes 53 which are located in positions substantially opposite each other in the circumferential direction and which reach the solder hole 51 from the outer surface. Rod-shaped members 5ta are respectively inserted into the through holes 53, and the tip end portions of the two rod-shaped members 5ta are protruded inward from the positions substantially opposite each other on the inner wall of the solder hole 51 so as to form rod-shaped protrusions. The protrusion portions function as the reception portion for receiving the solder piece Wh supplied from above into the iron tip 5. The number of rod-shaped members 5ta may be three or more, and the attachment positions thereof may be any positions in the circumferential direction. However, in order to receive the solder piece Wh, the amount of protrusion of the tip end portion of the rod-shaped member 5ta from the inner wall and the shape thereof are set as necessary. The rod-shaped member 5ta is fixed to the iron tip 5 with a fixing member such as an adhesive. Alternatively, the rod-shaped member 5ta may be removably fixed with a screw or the like. The cross-sectional shape of the rod-shaped member 5ta may be any shape such as a circle, a rectangle or a polygon.

Figure 11:
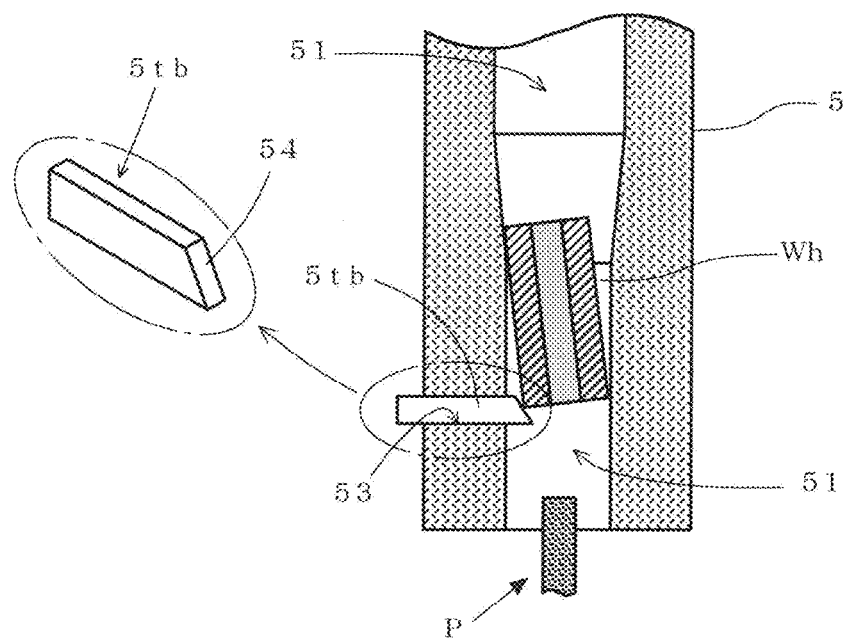
FIG. 11 An illustrative diagram showing another example of the second embodiment.

In the iron tip 5 shown in FIG. 11, as in the example shown in FIG. 9, a rod-shaped member 5tb is inserted inward from the outer surface, and the tip end portion of the rod-shaped member 5tb is protruded from the inner wall of the solder hole 51 in the iron tip 5 so as to form a rod-shaped protrusion. In the tip end portion of the rod-shaped member 5tb, its upper surface is an inclined surface 54 which is inclined downward toward the tip end. In this way, when the solder piece Wh supplied from above into the iron tip 5 is received by the inclined surface 54 of the rod-shaped member 5tb, the solder piece Wh is inclined, the lower end portion of the solder piece Wh is brought into contact with the rod-shaped member 5tb and the upper end portion of the solder piece Wh is brought into contact with the inner wall of the iron tip 5.

Figure 12:
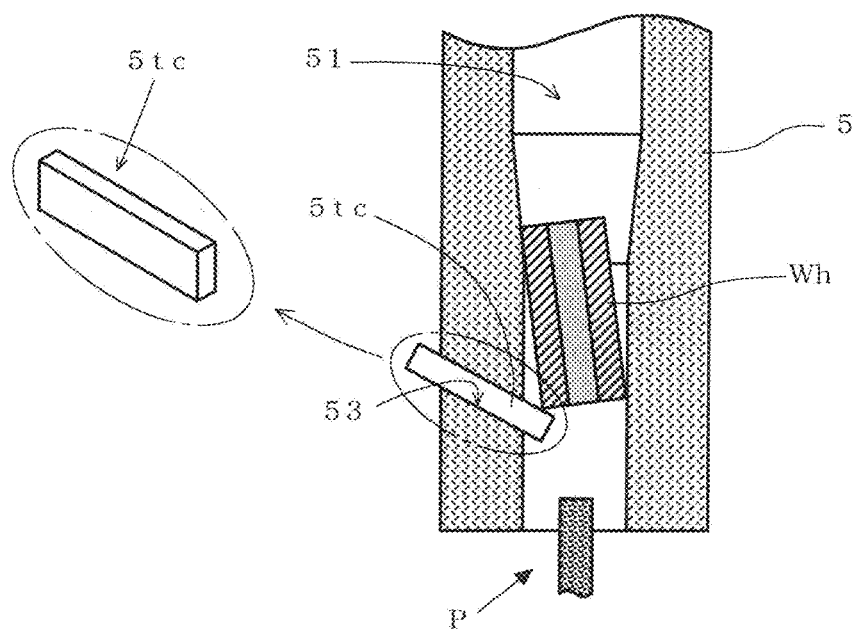
FIG. 12 An illustrative diagram showing another example of the second embodiment.

The iron tip 5 shown in FIG. 12 includes a through hole 53 which is inclined downward from the outer surface toward the inner wall of the solder hole 51. A rod-shaped member 5tc is inserted into the through hole 53, and the tip end portion of the rod-shaped member 5tc forms a rod-shaped protrusion which is protruded inward from the inner wall of the solder hole 51. The protrusion portion functions as the reception portion for receiving the solder piece Wh supplied from above into the iron tip 5. Since the tip end portion of the rod-shaped member 5tc protruded from the inner wall of the solder hole 51 is inclined downward, as in the iron tip shown in FIG. 11, when the solder piece Wh supplied from above into the iron tip 5 is received by the tip end portion of the rod-shaped member 5tc, the solder piece Wh is inclined, the lower end portion of the solder piece Wh is brought into contact with the rod-shaped member 5tc and the upper end portion of the solder piece Wh is brought into contact with the inner wall of the solder piece Wh.

Figure 13:
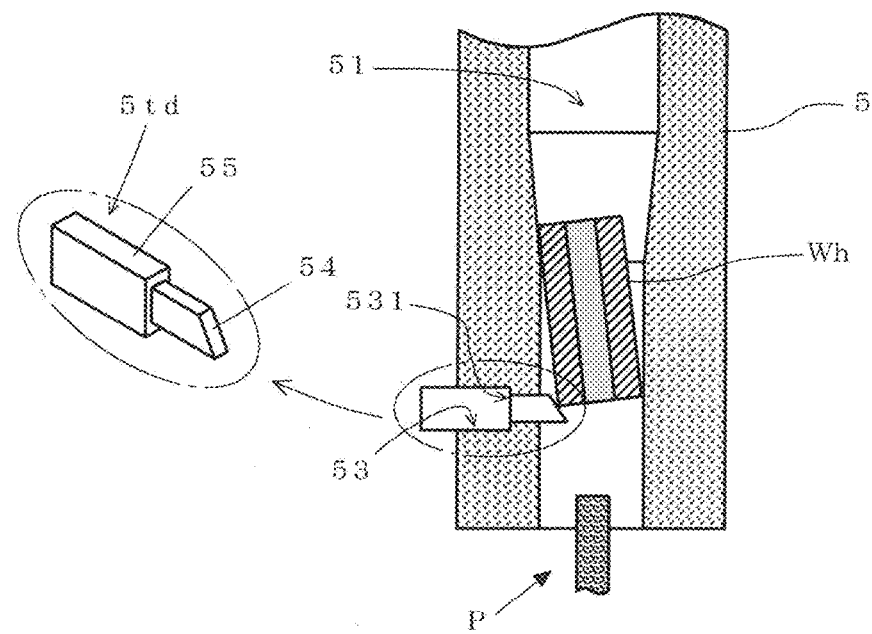
FIG. 13 An illustrative diagram showing another example of the second embodiment.
Figure 14:
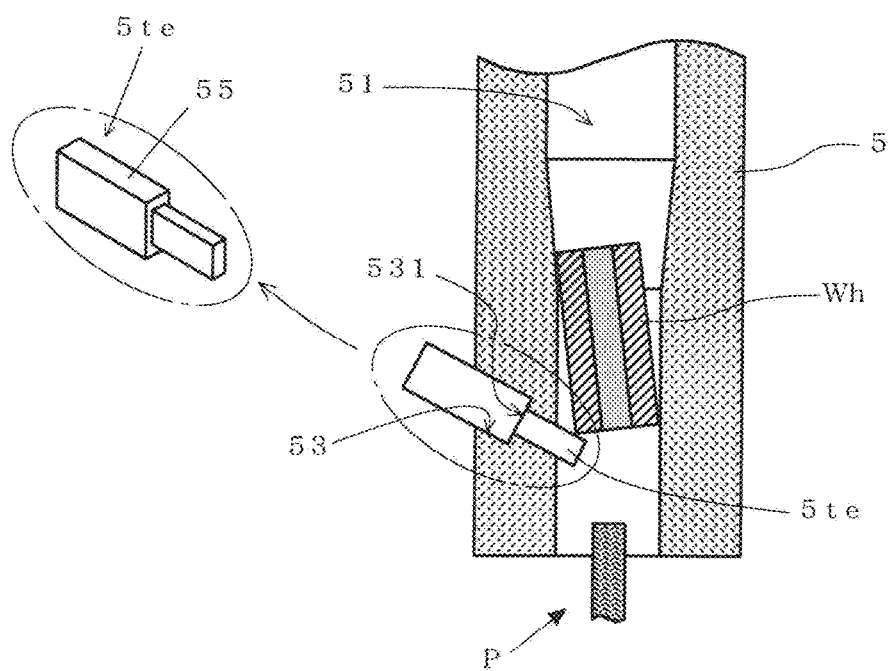
FIG. 14 An illustrative diagram showing another example of the second embodiment.

In the iron tips shown in FIGS. 11 and 12, the amounts of protrusion of the rod-shaped members 5tb and 5tc from the inner walls of the solder holes 51 can be adjusted by the amounts of insertion of the rod-shaped members 5tb and 5tc the iron tips 5. However, when it is desired to make constant the amounts of protrusion of the rod-shaped members from the inner walls of the solder holes 51, for example, as shown in FIGS. 13 and 14, enlarged diameter portions 55 whose diameters are enlarged outward are provided on the back sides of the rod-shaped members 5tb and 5te in the direction of insertion, and step portions 531 whose diameters are reduced toward the inner walls are provided partway through the through holes 53 formed in the iron tips. As the rod-shaped members 5td and 5te are inserted into the through holes 53, the enlarged diameter portions 55 of the rod-shaped members 5td and 5te make contact with the step portions 531 of the through holes 53, and thus the rod-shaped members 5td and 5te are located, that is, the amounts of protrusion of the rod-shaped members 5td and 5te from the inner walls of the solder holes 51 are determined to be predetermined amounts. The enlarged diameter portions 55 of the rod-shaped members 5td and 5te are preferably protruded in a substantially vertical direction with respect to the direction of insertion in which the enlarged diameter portions 55 make contact with the step portions 531 of the through holes 53, and parts of the rod-shaped members in the circumferential direction may be protruded. The step portions 531 may be gradually narrowed toward the inner walls of the solder holes 51. In this case, preferably, the enlarged diameter portions 55 are gradually enlarged toward the back thereof in the direction of insertion so as to make contact with the step portions 531 without any gap.

Figure 15A:
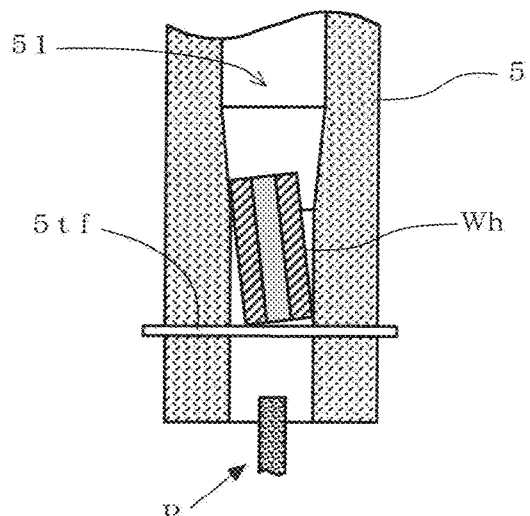
FIG. 15A An illustrative diagram showing another example of the second embodiment.
Figure 15B:
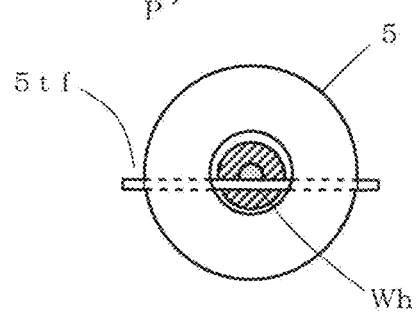
FIG. 15B An illustrative diagram showing another example of the second embodiment.

In an iron tip 5 shown in FIGS. 15A and 15B, a rod-shaped member 5tf is provided which is inserted inward from an outer surface on one side and which passes through the inner wall to reach the outer surface on the opposite side. FIG. 15A is a vertical cross-sectional view which passes through the center axis of the iron tip 5, and FIG. 15B is a bottom view. The maximum gap of the solder hole 51 between portions obtained by division into two by the rod-shaped member 5tf is set smaller than the outside diameter of the solder piece Wh. In this way, part of the rod-shaped member 5tf which passes through the inner wall of the iron tip 5 functions as the reception portion for receiving the solder piece Wh supplied from above into the iron tip 5.

The rod-shaped member 5tf is fixed to the iron tip 5 with a fixing member such as an adhesive. Alternatively, the rod-shaped member 5tf may be removably fixed with a screw or the like. The cross-sectional shape of the rod-shaped member 5tf may be any shape such as a circle, a rectangle or a polygon.

Figure 16:
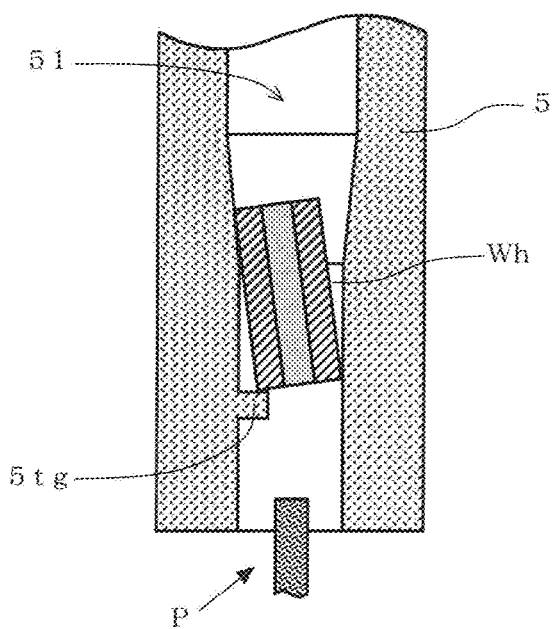
FIG. 16 An illustrative diagram showing another example of the second embodiment.

In an iron tip 5 shown in FIG. 16, a protrusion 5tg which is protruded from the inner wall in a center direction is formed integrally with the iron tip 5. The inside diameter of the iron tip 5 narrowed by the protrusion 5tg is set smaller than the outside diameter of the solder piece Wh. In this way, part of the protrusion 5tg of the iron tip 5 functions as the reception portion for receiving the solder piece Wh supplied from above into the iron tip 5. The cross-sectional shape of the protrusion 5tg may be any shape such as a circle, a rectangle or a polygon.

Figure 17A:
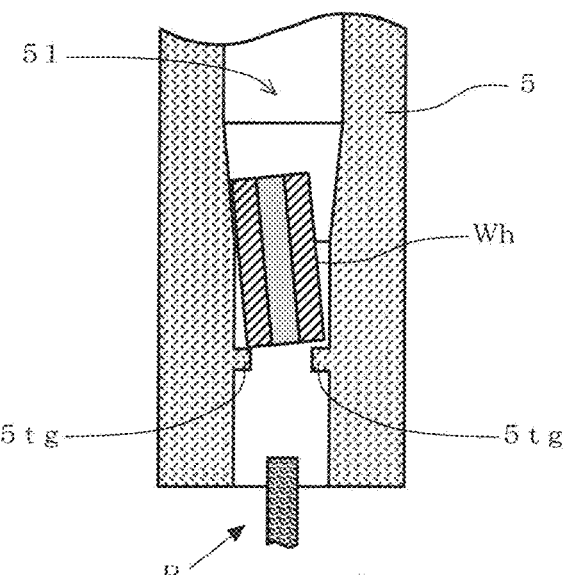
FIG. 17A An illustrative diagram showing another example of the second embodiment.
Figure 17B:
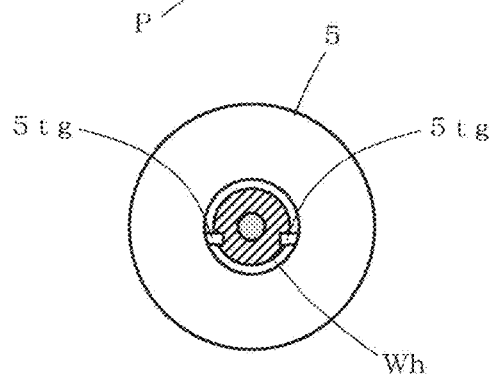
FIG. 17B An illustrative diagram showing another example of the second embodiment.
Figure 18A:
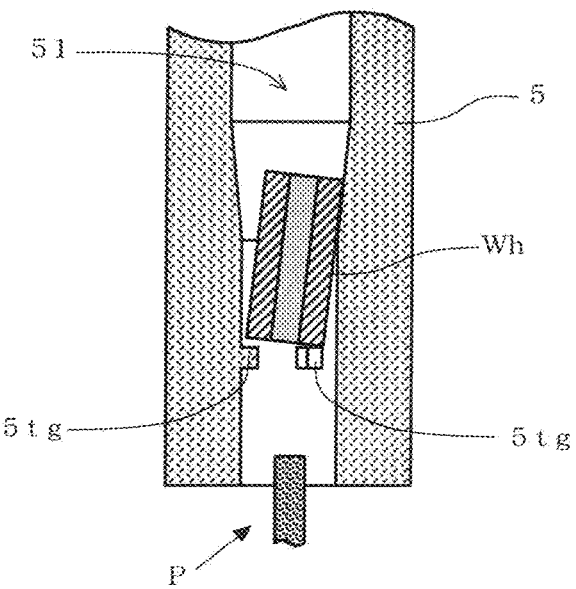
FIG. 18A An illustrative diagram showing another example of the second embodiment.
Figure 18B:
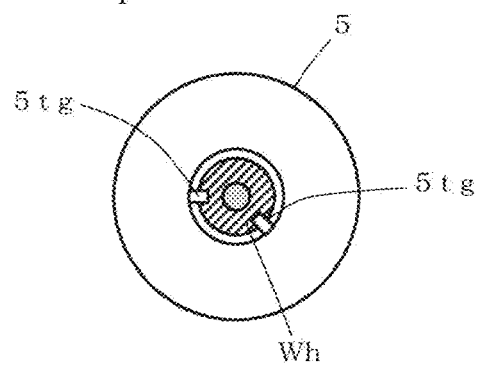
FIG. 18B An illustrative diagram showing another example of the second embodiment.

As shown in FIGS. 17A, 17B, 18A and 18B, a plurality of protrusions 5*tg* formed integrally with the iron tip 5 may be provided on the inner wall in the circumferential direction. The positions of the protrusions 5*tg* formed may be located at equal angles in the circumferential direction or may be located at unequal angles in the circumferential direction. When the protrusions 5*tg* are formed at unequal angles in the circumferential direction, the solder piece Wh received by the protrusions 5*tg* is inclined as shown in FIGS. 18A and 18B, the lower end portion of the solder piece Wh is brought into contact with the protrusion 5*tg* and the upper end portion of the solder piece Wh is brought into contact with the inner wall of the iron tip 5. FIGS. 17A and 18A are vertical cross-sectional views which pass through the center axis of the iron tip 5, and FIGS. 17B and 18B are bottom views.

3. Third Embodiment

The third embodiment will then be described. The third embodiment is basically the same as the first embodiment except the principle for forcefully bringing the solder piece Wh into contact with the inner wall of the iron tip 5. In the following description, emphasis is placed on the description of portions which differ from those in the first embodiment, and the description of the common portions may be omitted.

As in the first embodiment, the soldering device A of the present embodiment also solders, to the wiring board Bd, the terminal P of the electronic component Ep protruded upward. Even in the present embodiment, in a state where the tip end of the terminal P enters the iron tip 5 from below, the solder piece Wh is supplied from above into the iron tip 5.

However, in the soldering device A of the present embodiment, the supplied solder piece Wh is not received by the reception portion (step 5*s*) but in a state where the solder piece Wh is erected on the tip end of the terminal P, the solder piece Wh is inclined, with the result that the solder piece Wh is forcefully brought into contact with the inner wall of the iron tip 5. Specific examples of the present embodiment will be described below with reference to FIGS. 19 and 20.

Figure 19:
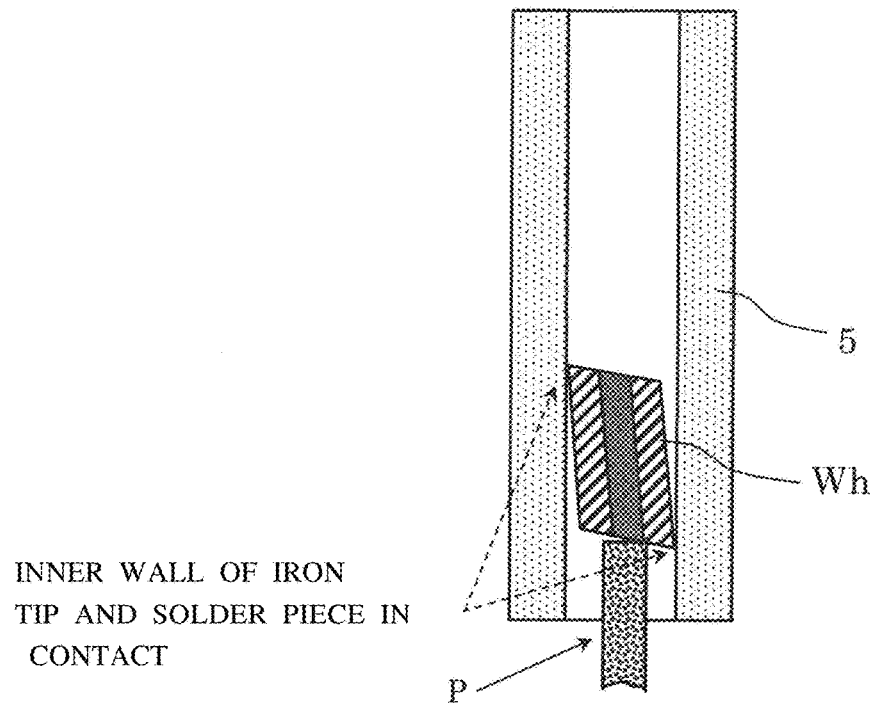
FIG. 19 An illustrative diagram of a state where the solder piece is supplied into the iron tip in a third embodiment.

FIG. 19 shows an example where the wire solder W is obliquely cut so as to produce the solder piece Wh and where thus the solder piece Wh is inclined within the iron tip 5. In the soldering device A of this example, the cutter unit 2 is formed so as to obliquely cut the wire solder W (in a direction inclined from the radial direction of the wire solder W), and thus the solder piece Wh whose end surfaces are inclined is produced.

Since the end surfaces of the solder piece Wh are inclined, the solder piece Wh is not erected straight on the terminal P but as shown in FIG. 19, the solder piece Wh is erected so as to be inclined by being supported by the inner wall of the iron tip 5. Hence, in the example shown in FIG. 19, the solder piece Wh can be forcefully brought into contact with the inner wall of the iron tip 5.

Figure 20:
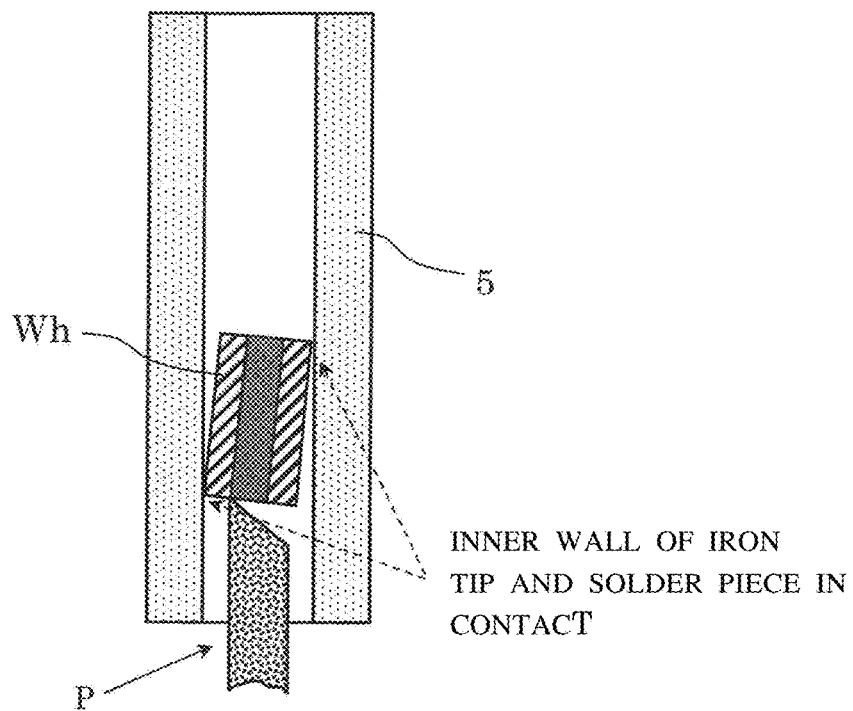
FIG. 20 Another illustrative diagram of the state where the solder piece is supplied into the iron tip in the third embodiment.

FIG. 20 shows an example where the tip end of the terminal P of the electronic component Ep is obliquely inclined such that the solder piece Wh is inclined within the iron tip 5. In this example, since the surface of the tip end of the terminal P is obliquely inclined even when the end surfaces of the solder piece Wh are not inclined, the solder piece Wh riding thereon is not erected straight but as shown in FIG. 20, the solder piece Wh is erected so as to be inclined by being supported by the inner wall of the iron tip 5. Hence, even in the example shown in FIG. 20, the solder piece Wh can also be forcefully brought into contact with the inner wall of the iron tip 5.

4. Fourth Embodiment

The fourth embodiment will then be described. The fourth embodiment is basically the same as the first embodiment except the principle for forcefully bring the solder piece Wh into contact with the inner wall of the iron tip 5. In the following description, emphasis is placed on the description of portions which differ from those in the first embodiment, and the description of the common portions may be omitted.

As in the first embodiment, the soldering device A of the present embodiment also solders, to the wiring board Bd, the terminal P of the electronic component Ep protruded upward. Even in the present embodiment, in a state where the tip end of the terminal P enters the iron tip 5 from below, the solder piece Wh is supplied from above into the iron tip 5.

However, in the soldering device A of the present embodiment, the supplied solder piece Wh is not received by the reception portion (step 5*s*) but in a state where the solder piece Wh is erected on the tip end of the terminal P, the inner wall of the iron tip 5 is extended so as to be inclined with respect to the up/down direction (in other words, the solder hole 51 is extended so as to be inclined with respect to the up/down direction), with the result that the solder piece Wh is forcefully brought into contact with the inner wall of the iron tip 5. Specific examples of the present embodiment will be described below with reference to FIGS. 21 and 22.

Figure 21:
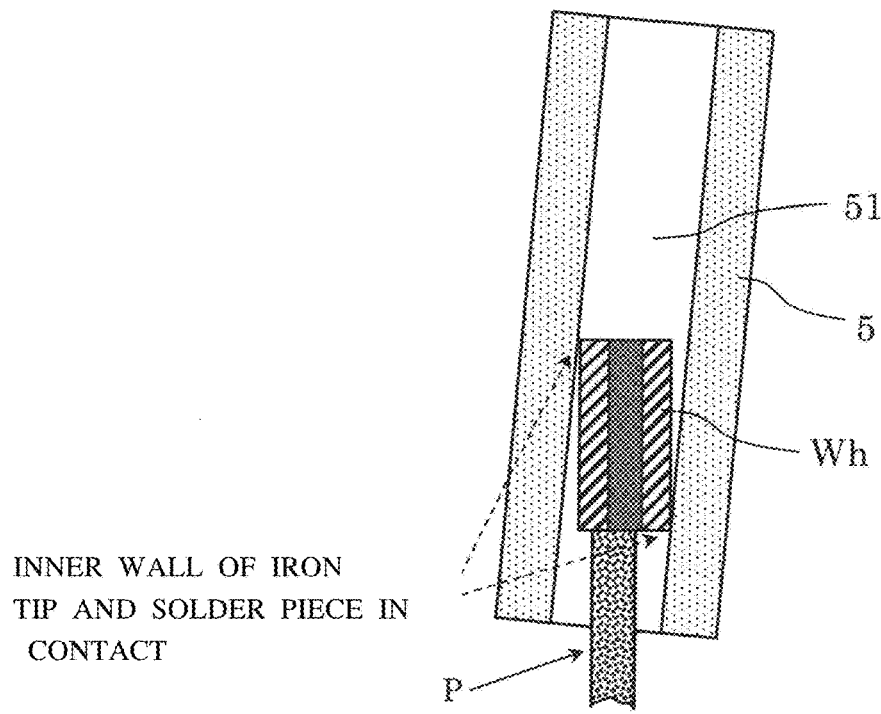
FIG. 21 An illustrative diagram of a state where the solder piece is supplied into the iron tip in a fourth embodiment.

FIG. 21 shows an example where the entire iron tip 5 is arranged so as to be inclined with respect to the up/down direction, and where thus the solder hole 51 is extended so as to be inclined with respect to the up/down direction. In this example, the general tubular iron tip 5 as shown in FIG. 19 is used, and thus the inner wall of the iron tip 5 can be extended so as to be inclined with respect to the up/down direction.

Figure 22:
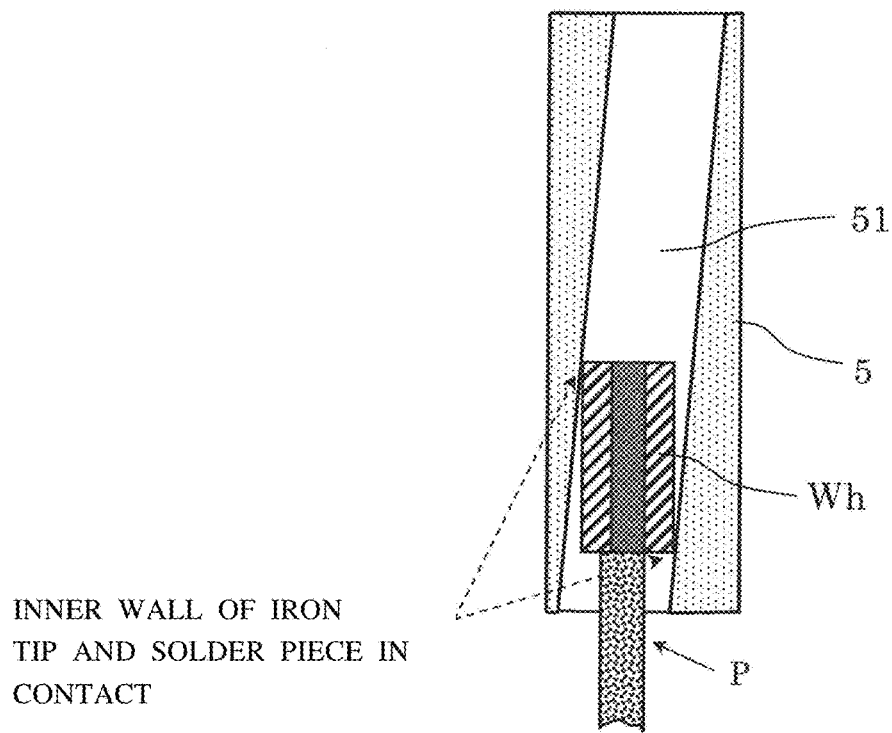
FIG. 22 Another illustrative diagram of the state where the solder piece is supplied into the iron tip in the fourth embodiment.

FIG. 22 shows an example where the solder hole 51 is provided so as to be extended within the iron tip 5 in a direction inclined with respect to the up/down direction, and where thus the solder hole 51 is extended so as to be inclined with respect to the up/down direction. In this example, the inner wall of the iron tip 5 can be extended so as to be inclined with respect to the up/down direction without the iron tip 5 itself being inclined with respect to the up/down direction.

In the soldering device A of the present embodiment, as shown in FIGS. 21 and 22, it is possible to reliably bring parts of the lower end portion and the upper end portion of the solder piece Wh into contact with the inner wall of the iron tip 5. With consideration given to the inside diameter of the solder hole 51, the outside diameter and the length of the solder piece Wh and the like, the degree of the inclination of the direction of extension of the solder hole 51 with respect to the up/down direction is appropriately set such that the solder piece Wh is reliably brought into contact with the inner wall of the iron tip 5.

5. Overview

The soldering device A according to each of the embodiments described above includes: the tubular iron tip 5 that can be heated and that is extended vertically; and a solder piece supply portion (including the solder feed mechanism 6 and the cutter unit 2) that supplies the solder piece Wh from above into the iron tip 5, and the heat of the iron tip 5 is used to melt the solder piece Wh such that the molten solder is supplied downward. Furthermore, the soldering device A is configured so as to forcefully bring the supplied solder piece Wh into contact with the inner wall of the iron tip 5. Hence, in the soldering device A, the heat of the iron tip 5 is used, and thus it is possible to more reliably heat and melt the solder piece Wh.

Although the embodiments of the present invention have been described above, the present invention is not limited to the details thereof. In the embodiments of the present invention, various variations can be added without departing from the spirit of the invention.

REFERENCE SIGNS LIST

A soldering device (solder processing device)
1 support portion
11 wall member
12 holding portion
13 sliding guide
14 heater unit fixing portion
15 actuator holding portion
16 spring holding portion
2 cutter unit
21 cutter upper blade
211 upper blade hole
212 pin hole
22 cutter lower blade
221 lower blade hole
23 pusher pin
231 rod portion
232 head portion
233 spring
3 drive mechanism
31 air cylinder
32 piston rod
33 cam member
330 concave portion
331 support hole
332 pin
333 pin pushing portion
334 bearing
34 slider portion
340 cam groove
341 first groove portion
342 second groove portion
343 connection groove portion
35 guide shaft
4 heater unit
41 heater
42 heater block
421 concave portion
422 solder supply hole
5 iron tip
5s step
5t rod-shaped member
5ta to 5tg rod-shaped member
51 solder hole
52 burr
53 through hole
55 enlarged diameter portion
531 step portion
6 solder feed mechanism
61a, 61b feed roller
62 guide tube
P terminal
W wire solder
Wh solder piece
Bd wiring board
Ep electronic component
Ld land

The invention claimed is:

1. A solder processing device which includes:
a tubular iron tip that can be heated and that is extended vertically;
a solder piece supply portion that includes one or more cutter blades that cut wire solder to produce a solder piece and supplies the solder piece into the iron tip; and
a heater unit that includes a heater block and a heater that heats the heater block, the heater block including a concave portion to which the iron tip is attached such that a solder supply hole of the heater block is connected to and communicated with a solder hole of the iron tip such that the solder piece is supplied from the solder piece supply portion to the solder hole of the iron tip via the solder supply hole of the heater block, wherein
heat of the iron tip is used to melt the solder piece in the iron tip such that the molten solder is supplied downward,
the iron tip includes a reception portion protruding inwardly from an inner wall of the iron tip such that the reception portion receives the supplied solder piece thereon in the iron tip,
in a state where the solder piece is held so as to be erected on the reception portion, the supplied solder piece is brought into contact with the inner wall of the iron tip and melted, and
the heater block includes an upper surface and a lower surface opposite to each other in the vertical direction, the concave portion is recessed from the lower surface of the heater block, and an upper end of the iron tip is inserted in and attached to the concave portion in such a manner that the solder supply hole of the heater block is connected to and communicated with the solder hole of the iron tip.

2. The solder processing device according to claim 1, wherein the reception portion is formed such that an inside diameter of the iron tip at the reception portion is smaller than an outside diameter of the solder piece.

3. The solder processing device according to claim 2, wherein the reception portion is formed such that the inside diameter of the iron tip at the reception portion is gradually decreased as the iron tip is extended downward.

4. The solder processing device according to claim 1, wherein the solder piece supply portion produces the solder piece in which a burr is produced by cutting the wire solder, and
the reception portion is formed so as to receive the solder piece by catching of the burr.

5. The solder processing device according to claim 1, wherein the reception portion is a substantially rod-shaped protrusion which is protruded from the inner wall of the iron tip.

6. The solder processing device according to claim 5, wherein an upper surface of a tip end portion of the protrusion is inclined downward as the upper surface is extended to the tip end portion.

7. The solder processing device according to claim 5, wherein the protrusion is formed integrally with the iron tip.

8. The solder processing device according to claim 5,
wherein the protrusion is formed with a rod-shaped member which is inserted into a through hole that is formed in the iron tip so as to be extended from an outer surface to the inner wall.

9. The solder processing device according to claim 8,
wherein the rod-shaped member includes an enlarged diameter portion, and
the enlarged diameter portion makes contact with the iron tip such that an amount of protrusion of the rod-shaped member from the inner wall of the iron tip is determined.

10. The solder processing device according to claim 9,
wherein the through hole includes a step portion which is narrowed toward a direction of the inner wall of the iron tip, and
the enlarged diameter portion makes contact with the step portion such that the amount of protrusion of the rod-shaped member from the inner wall of the iron tip is determined.

11. The solder processing device according to claim 1,
wherein the reception portion is a substantially rod-shaped member which passes through the inner wall of the iron tip.

12. The solder processing device according to claim 1,
wherein the iron tip is formed of a ceramic.

13. The solder processing device according to claim 1,
wherein
the reception portion is formed as a step at a boundary between an upper portion that is provided upper than the reception portion and a lower portion that is provided lower than the reception portion and whose inside diameter is smaller than an inside diameter of the upper portion.

14. The solder processing device according to claim 1,
wherein the heater is wound around an outer circumferential surface of the heater block, such that the heater unit heats the iron tip to melt the solder piece in the iron tip such that the molten solder is supplied downward.

* * * * *